(12) United States Patent
Rofougaran et al.

(10) Patent No.: US 8,422,967 B2
(45) Date of Patent: *Apr. 16, 2013

(54) METHOD AND SYSTEM FOR AMPLITUDE MODULATION UTILIZING A LEAKY WAVE ANTENNA

(75) Inventors: Ahmadreza Rofougaran, Newport Coast, CA (US); Maryam Rofougaran, Rancho Palos Verdes, CA (US)

(73) Assignee: Broadcom Corporation, Irvine, CA (US)

( * ) Notice: Subject to any disclaimer, the term of this patent is extended or adjusted under 35 U.S.C. 154(b) by 329 days.

This patent is subject to a terminal disclaimer.

(21) Appl. No.: 12/650,295

(22) Filed: Dec. 30, 2009

(65) Prior Publication Data

US 2010/0311380 A1    Dec. 9, 2010

Related U.S. Application Data

(60) Provisional application No. 61/246,618, filed on Sep. 29, 2009, provisional application No. 61/185,245, filed on Jun. 9, 2009.

(51) Int. Cl.
*H01Q 11/12* (2006.01)
*H04B 1/04* (2006.01)

(52) U.S. Cl.
USPC ............... 455/127.1; 455/121; 455/127.3; 455/129

(58) Field of Classification Search ......... 455/90, 455/121, 123, 127.1–127.5, 129, 107; 343/731, 343/762, 771
See application file for complete search history.

(56) References Cited

U.S. PATENT DOCUMENTS

| | | | |
|---|---|---|---|
| 4,150,382 A * | 4/1979 | King | 343/754 |
| 4,701,763 A | 10/1987 | Yamamoto | |
| 5,138,436 A | 8/1992 | Koepf | |
| 5,300,875 A | 4/1994 | Tuttle | |
| 5,363,075 A | 11/1994 | Fanucchi | |
| 5,387,885 A | 2/1995 | Chi | |
| 5,717,943 A | 2/1998 | Barker | |
| 5,900,843 A | 5/1999 | Lee | |
| 5,912,598 A | 6/1999 | Stones | |

(Continued)

OTHER PUBLICATIONS

Feresidis et al., "Flat Plate Millimetre Wave Antenna Based on Partially Reflective FSS", 11$^{th}$ International Conference on Antennas and Propagation, 2001, pp. 33-36.

(Continued)

*Primary Examiner* — Simon Nguyen
(74) *Attorney, Agent, or Firm* — Farjami & Farjami LLP

(57) ABSTRACT

Methods and systems for amplitude modulation using a leaky wave antenna are disclosed and may include amplitude modulating an output of one or more power amplifiers in a wireless device by modulating a bias current in the power amplifiers that are coupled to one or more leaky wave antennas. The leaky wave antennas may include a balun that may be integrated on the chip, on a package to which the chip may be affixed, and/or integrated on a printed circuit board to which the chip may be affixed. An output power of the power amplifiers may be adjusted by configuring a bias voltage on the leaky wave antennas. The bias voltage may be configured utilizing a DC to DC voltage controller. The bias current may be modulated via one or more switched current sources. The switched current sources may be binary weighted and/or may be current mirrors.

20 Claims, 10 Drawing Sheets

U.S. PATENT DOCUMENTS

| | | | |
|---|---|---|---|
| 6,005,520 A | 12/1999 | Nalbandian | |
| 6,037,743 A | 3/2000 | White | |
| 6,127,799 A | 10/2000 | Krishnan | |
| 6,212,431 B1 | 4/2001 | Hahn | |
| 6,285,325 B1 | 9/2001 | Nalbandian | |
| 6,317,095 B1 * | 11/2001 | Teshirogi et al. | 343/785 |
| 6,323,740 B1 * | 11/2001 | Ishikawa et al. | 333/21 R |
| 6,597,323 B2 | 7/2003 | Teshirogi | |
| 6,603,915 B2 | 8/2003 | Glebov | |
| 6,735,630 B1 | 5/2004 | Gelvin | |
| 6,771,935 B1 | 8/2004 | Leggett | |
| 6,841,981 B2 | 1/2005 | Smith | |
| 6,954,236 B1 | 10/2005 | Russell | |
| 7,002,517 B2 | 2/2006 | Noujeim | |
| 7,020,701 B1 | 3/2006 | Gelvin | |
| 7,023,374 B2 | 4/2006 | Jossef | |
| 7,084,823 B2 | 8/2006 | Caimi | |
| 7,245,269 B2 * | 7/2007 | Sievenpiper et al. | 343/909 |
| 7,253,780 B2 * | 8/2007 | Sievenpiper | 343/745 |
| 7,268,517 B2 | 9/2007 | Rahmel | |
| 7,317,342 B2 | 1/2008 | Saint-Laurent | |
| 7,330,090 B2 | 2/2008 | Itoh | |
| 7,348,928 B2 | 3/2008 | Ma | |
| 7,373,133 B2 | 5/2008 | Mickle | |
| 7,394,288 B1 | 7/2008 | Agarwal | |
| 7,535,958 B2 | 5/2009 | Best | |
| 7,592,957 B2 | 9/2009 | Achour | |
| 7,620,424 B2 | 11/2009 | Cetiner | |
| 7,733,265 B2 | 6/2010 | Margomenos | |
| 7,830,220 B2 * | 11/2010 | Ceylan et al. | 332/145 |
| 7,855,696 B2 | 12/2010 | Gummalla | |
| 8,019,293 B2 * | 9/2011 | Dagher et al. | 455/127.1 |
| 8,195,103 B2 | 6/2012 | Waheed | |
| 8,242,957 B2 | 8/2012 | Rofougaran | |
| 8,285,231 B2 | 10/2012 | Rofougaran | |
| 8,295,788 B2 | 10/2012 | Rofougaran | |
| 8,299,971 B2 | 10/2012 | Talty | |
| 2002/0000936 A1 | 1/2002 | Sheen | |
| 2002/0005807 A1 * | 1/2002 | Sheen | 343/700 MS |
| 2002/0041256 A1 | 4/2002 | Saitou | |
| 2002/0135568 A1 | 9/2002 | Chen | |
| 2003/0122729 A1 | 7/2003 | Diaz | |
| 2004/0066251 A1 | 4/2004 | Eleftheriades | |
| 2004/0203944 A1 | 10/2004 | Huomo | |
| 2004/0227668 A1 | 11/2004 | Sievenpiper | |
| 2004/0263378 A1 | 12/2004 | Jossef | |
| 2004/0263408 A1 | 12/2004 | Sievenpiper | |
| 2005/0012667 A1 * | 1/2005 | Noujeim | 343/700 MS |
| 2005/0052424 A1 | 3/2005 | Shih | |
| 2005/0116864 A1 | 6/2005 | Mohamadi | |
| 2005/0134579 A1 | 6/2005 | Hsieh | |
| 2005/0136972 A1 | 6/2005 | Smith | |
| 2006/0066326 A1 | 3/2006 | Slupsky | |
| 2006/0109127 A1 | 5/2006 | Barink | |
| 2006/0125703 A1 | 6/2006 | Ma | |
| 2006/0281423 A1 | 12/2006 | Caimi | |
| 2007/0171076 A1 | 7/2007 | Stevens | |
| 2007/0190952 A1 | 8/2007 | Waheed | |
| 2007/0273607 A1 | 11/2007 | Chen | |
| 2007/0285248 A1 | 12/2007 | Hamel | |
| 2007/0287403 A1 | 12/2007 | Sjoland | |
| 2008/0068174 A1 | 3/2008 | Al-Mahdawi | |
| 2008/0105966 A1 | 5/2008 | Beer | |
| 2008/0159243 A1 | 7/2008 | Rofougaran | |
| 2008/0231603 A1 | 9/2008 | Parkinson | |
| 2008/0258981 A1 | 10/2008 | Achour | |
| 2008/0278400 A1 | 11/2008 | Lohninger | |
| 2008/0284085 A1 | 11/2008 | Curina | |
| 2008/0316135 A1 | 12/2008 | Hilgers | |
| 2009/0108996 A1 | 4/2009 | Day | |
| 2009/0160612 A1 | 6/2009 | Varpula | |
| 2009/0245146 A1 * | 10/2009 | Gummalla et al. | 370/281 |
| 2009/0251362 A1 | 10/2009 | Margomenos | |
| 2010/0110943 A2 | 5/2010 | Gummalla | |
| 2010/0176880 A2 * | 7/2010 | Dupuy et al. | 330/124 R |
| 2010/0222105 A1 | 9/2010 | Nghiem | |
| 2010/0308668 A1 | 12/2010 | Rofougaran | |
| 2010/0308767 A1 | 12/2010 | Rofougaran | |
| 2010/0308885 A1 | 12/2010 | Rofougaran | |
| 2010/0308970 A1 | 12/2010 | Rofougaran | |
| 2010/0308997 A1 | 12/2010 | Rofougaran | |
| 2010/0309040 A1 | 12/2010 | Rofougaran | |
| 2010/0309056 A1 | 12/2010 | Rofougaran | |
| 2010/0309069 A1 | 12/2010 | Rofougaran | |
| 2010/0309071 A1 | 12/2010 | Rofougaran | |
| 2010/0309072 A1 | 12/2010 | Rofougaran | |
| 2010/0309073 A1 | 12/2010 | Rofougaran | |
| 2010/0309074 A1 | 12/2010 | Rofougaran | |
| 2010/0309075 A1 | 12/2010 | Rofougaran | |
| 2010/0309076 A1 | 12/2010 | Rofougaran | |
| 2010/0309077 A1 | 12/2010 | Rofougaran | |
| 2010/0309078 A1 | 12/2010 | Rofougaran | |
| 2010/0309079 A1 | 12/2010 | Rofougaran | |
| 2010/0309824 A1 | 12/2010 | Rofougaran | |
| 2010/0311324 A1 | 12/2010 | Rofougaran | |
| 2010/0311332 A1 | 12/2010 | Rofougaran | |
| 2010/0311333 A1 | 12/2010 | Rofougaran | |
| 2010/0311338 A1 | 12/2010 | Rofougaran | |
| 2010/0311340 A1 | 12/2010 | Rofougaran | |
| 2010/0311355 A1 | 12/2010 | Rofougaran | |
| 2010/0311356 A1 | 12/2010 | Rofougaran | |
| 2010/0311359 A1 * | 12/2010 | Rofougaran et al. | 455/110 |
| 2010/0311363 A1 | 12/2010 | Rofougaran | |
| 2010/0311364 A1 | 12/2010 | Rofougaran | |
| 2010/0311367 A1 | 12/2010 | Rofougaran | |
| 2010/0311368 A1 | 12/2010 | Rofougaran | |
| 2010/0311369 A1 | 12/2010 | Rofougaran | |
| 2010/0311376 A1 | 12/2010 | Rofougaran | |
| 2010/0311379 A1 | 12/2010 | Rofougaran | |
| 2010/0311380 A1 | 12/2010 | Rofougaran | |
| 2010/0311472 A1 | 12/2010 | Rofougaran | |
| 2010/0311493 A1 | 12/2010 | Miller | |
| 2011/0035491 A1 * | 2/2011 | Gelvin et al. | 709/224 |
| 2012/0095531 A1 | 4/2012 | Derbas | |
| 2012/0153731 A9 | 6/2012 | Kirby | |
| 2012/0263256 A1 | 10/2012 | Waheed | |

OTHER PUBLICATIONS

Iyer et al., "Wireless chip to chip interconnections for multichip modules using leaky wave antennas", Nov. 1993, pp. 2030-2031.

Huang et al., "An Electronically Switchable Leaky Wave Antenna", Nov. 2000, pp. 1769-1772.

Grbic et al., "Leaky CPW-Based Slot Antenna Arrays for Millimeter-Wave Applications", Nov. 2002, pp. 1494-1504.

Floyd et al., "Wireless Interconnects for Clock Distribution", pp. 105-108.

Zvolensky et al., "Leaky-Wave antenna based on micro-electromechanical systems-loaded microstrip line", 2011, pp. 357-363.

O, K.K. et al., "Silicon Integrated Circuits Incorporating Antennas", IEEE Custom Integrated Circuits Conference, 2006, pp. 473-480.

Sterner et al., "RF MEMS High-Impedance Tuneable Metamaterials for Millimeter-Wave Beam Steering", Micro Electro Mechanical Systems, 2009, pp. 896-899.

Ourir et al., "Electronically Reconfigurable Metamaterial for Compact Directive Cavity Antennas", Electronics Letters, 2007.

Kimoto et al., "On-Chip Wireless Signal Transmission using Silicon Integrated Antennas", Measurement 40, No. 30, (2004): 20.

* cited by examiner

METHOD AND SYSTEM FOR AMPLITUDE MODULATION UTILIZING A LEAKY WAVE ANTENNA

CROSS-REFERENCE TO RELATED APPLICATIONS/INCORPORATION BY REFERENCE

This application makes reference to and claims priority to U.S. Provisional Application Ser. No. 61/246,618 filed on Sep. 29, 2009, and U.S. Provisional Application Ser. No. 61/185,245 filed on Jun. 9, 2009, each of which is hereby incorporated herein by reference in its entirety.

This application also makes reference to:
U.S. patent application Ser. No. 12/650,212 filed on even date herewith;
U.S. patent application Ser. No. 12/650,277 filed on even date herewith;
U.S. patent application Ser. No. 12/650,192 filed on even date herewith;
U.S. patent application Ser. No. 12/650,224 filed on even date herewith;
U.S. patent application Ser. No. 12/650,176 filed on even date herewith;
U.S. patent application Ser. No. 12/650,246 filed on even date herewith;
U.S. patent application Ser. No. 12/650,292 filed on even date herewith; and
U.S. patent application Ser. No. 12/650,324 filed on even date herewith.

Each of the above stated applications is hereby incorporated herein by reference in its entirety.

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to wireless communication. More specifically, certain embodiments of the invention relate to a method and system for amplitude modulation using a leaky wave antenna.

BACKGROUND OF THE INVENTION

Mobile communications have changed the way people communicate and mobile phones have been transformed from a luxury item to an essential part of every day life. The use of mobile phones is today dictated by social situations, rather than hampered by location or technology. While voice connections fulfill the basic need to communicate, and mobile voice connections continue to filter even further into the fabric of every day life, the mobile Internet is the next step in the mobile communication revolution. The mobile Internet is poised to become a common source of everyday information, and easy, versatile mobile access to this data will be taken for granted.

As the number of electronic devices enabled for wireline and/or mobile communications continues to increase, significant efforts exist with regard to making such devices more power efficient. For example, a large percentage of communications devices are mobile wireless devices and thus often operate on battery power. Additionally, transmit and/or receive circuitry within such mobile wireless devices often account for a significant portion of the power consumed within these devices. Moreover, in some conventional communication systems, transmitters and/or receivers are often power inefficient in comparison to other blocks of the portable communication devices. Accordingly, these transmitters and/or receivers have a significant impact on battery life for these mobile wireless devices.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for amplitude modulation using a leaky wave antenna, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a method and system for amplitude modulation using a leaky wave antenna. Exemplary aspects of the invention may comprise amplitude modulating an output of one or more power amplifiers in a wireless device by modulating a bias current in the one or more power amplifiers that are coupled to one or more leaky wave antennas. In this regard, an amplitude modulated signal may be transmitted from the one or more leaky wave antennas. The one or more leaky wave antennas may comprise a balun that may be integrated on the chip, integrated on a package to which the chip may be affixed, and/or integrated on a printed circuit board to which the chip may be affixed. An output power of the one or more power amplifiers may be adjusted by configuring a bias voltage on the one or more leaky wave antennas. The bias voltage may be configured utilizing a DC to DC voltage controller. The bias current may be modulated via one or more switched current sources. The one or more switched current sources may be binary weighted and/or may be configured as current mirrors.

Figure 1:
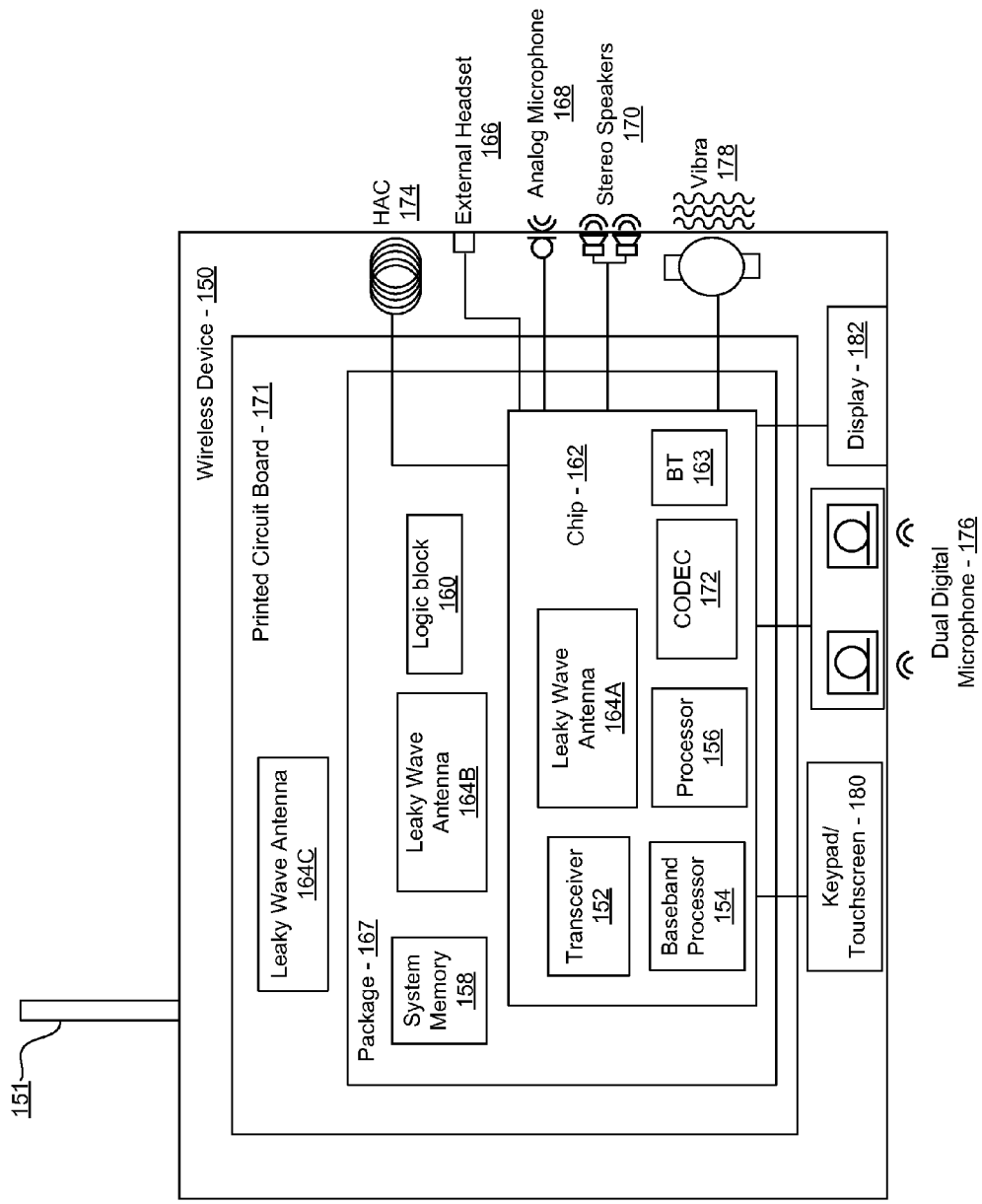
FIG. 1 is a block diagram of an exemplary wireless system utilizing leaky wave antennas and enabling amplitude modulation, which may be utilized in accordance with an embodiment of the invention.

FIG. 1 is a block diagram of an exemplary wireless system utilizing leaky wave antennas and enabling amplitude modulation, which may be utilized in accordance with an embodiment of the invention. Referring to FIG. 1, the wireless device 150 may comprise an antenna 151, a transceiver 152, a baseband processor 154, a processor 156, a system memory 158, a logic block 160, a chip 162, leaky wave antennas 164A, 164B, and 164C, an external headset port 166, and a package 167. The wireless device 150 may also comprise an analog microphone 168, integrated hands-free (IHF) stereo speakers 170, a printed circuit board 171, a hearing aid compatible (HAC) coil 174, a dual digital microphone 176, a vibration transducer 178, a keypad and/or touchscreen 180, and a display 182.

The transceiver 152 may comprise suitable logic, circuitry, interface(s), and/or code that may be enabled to modulate and upconvert baseband signals to RF signals for transmission by one or more antennas, which may be represented generically by the antenna 151. The transceiver 152 may also be enabled to downconvert and demodulate received RF signals to baseband signals. The RF signals may be received by one or more antennas, which may be represented generically by the antenna 151, or the leaky wave antennas 164A, 164B, and 164C. Different wireless systems may use different antennas for transmission and reception. The transceiver 152 may be enabled to execute other functions, for example, filtering the baseband and/or RF signals, and/or amplifying the baseband and/or RF signals. Although a single transceiver 152 is shown, the invention is not so limited. Accordingly, the transceiver 152 may be implemented as a separate transmitter and a separate receiver. In addition, there may be a plurality of transceivers, transmitters and/or receivers. In this regard, the plurality of transceivers, transmitters and/or receivers may enable the wireless device 150 to handle a plurality of wireless protocols and/or standards including cellular, WLAN and PAN. Wireless technologies handled by the wireless device 150 may comprise GSM, CDMA, CDMA2000, WCDMA, GMS, GPRS, EDGE, WIMAX, WLAN, 3GPP, UMTS, BLUETOOTH, and ZigBee, for example.

The baseband processor 154 may comprise suitable logic, circuitry, interface(s), and/or code that may be enabled to process baseband signals for transmission via the transceiver 152 and/or the baseband signals received from the transceiver 152. The processor 156 may be any suitable processor or controller such as a CPU, DSP, ARM, or any type of integrated circuit processor. The processor 156 may comprise suitable logic, circuitry, and/or code that may be enabled to control the operations of the transceiver 152 and/or the baseband processor 154. For example, the processor 156 may be utilized to update and/or modify programmable parameters and/or values in a plurality of components, devices, and/or processing elements in the transceiver 152 and/or the baseband processor 154. At least a portion of the programmable parameters may be stored in the system memory 158.

Control and/or data information, which may comprise the programmable parameters, may be transferred from other portions of the wireless device 150, not shown in FIG. 1, to the processor 156. Similarly, the processor 156 may be enabled to transfer control and/or data information, which may include the programmable parameters, to other portions of the wireless device 150, not shown in FIG. 1, which may be part of the wireless device 150.

The processor 156 may utilize the received control and/or data information, which may comprise the programmable parameters, to determine an operating mode of the transceiver 152. For example, the processor 156 may be utilized to select a specific frequency for a local oscillator, a specific gain for a variable gain amplifier, configure the local oscillator and/or configure the variable gain amplifier for operation in accordance with various embodiments of the invention. Moreover, the specific frequency selected and/or parameters needed to calculate the specific frequency, and/or the specific gain value and/or the parameters, which may be utilized to calculate the specific gain, may be stored in the system memory 158 via the processor 156, for example. The information stored in system memory 158 may be transferred to the transceiver 152 from the system memory 158 via the processor 156.

The system memory 158 may comprise suitable logic, circuitry, interface(s), and/or code that may be enabled to store a plurality of control and/or data information, including parameters needed to calculate frequencies and/or gain, and/or the frequency value and/or gain value. The system memory 158 may store at least a portion of the programmable parameters that may be manipulated by the processor 156.

The logic block 160 may comprise suitable logic, circuitry, interface(s), and/or code that may enable controlling of various functionalities of the wireless device 150. For example, the logic block 160 may comprise one or more state machines that may generate signals to control the transceiver 152 and/or the baseband processor 154. The logic block 160 may also comprise registers that may hold data for controlling, for example, the transceiver 152 and/or the baseband processor 154. The logic block 160 may also generate and/or store status information that may be read by, for example, the processor 156. Amplifier gains and/or filtering characteristics, for example, may be controlled by the logic block 160.

The BT radio/processor 163 may comprise suitable circuitry, logic, interface(s), and/or code that may enable transmission and reception of Bluetooth signals. The BT radio/processor 163 may enable processing and/or handling of BT baseband signals. In this regard, the BT radio/processor 163 may process or handle BT signals received and/or BT signals transmitted via a wireless communication medium. The BT radio/processor 163 may also provide control and/or feedback information to/from the baseband processor 154 and/or the processor 156, based on information from the processed BT signals. The BT radio/processor 163 may communicate information and/or data from the processed BT signals to the processor 156 and/or to the system memory 158. Moreover, the BT radio/processor 163 may receive information from the processor 156 and/or the system memory 158, which may be processed and transmitted via the wireless communication medium a Bluetooth headset, for example The CODEC 172 may comprise suitable circuitry, logic, interface(s), and/or code that may process audio signals received from and/or communicated to input/output devices. The input devices may be within or communicatively coupled to the wireless device 150, and may comprise the analog microphone 168, the stereo speakers 170, the hearing aid compatible (HAC) coil 174, the dual digital microphone 176, and the vibration transducer 178, for example. The CODEC 172 may be operable to up-convert and/or down-convert signal frequencies to desired frequencies for processing and/or transmission via an output device. The CODEC 172 may enable utilizing a plurality of digital audio inputs, such as 16 or 18-bit inputs, for example. The CODEC 172 may also enable utilizing a plurality of data sampling rate inputs. For example, the CODEC 172 may accept digital audio signals at sampling rates such as 8 kHz, 11.025 kHz, 12 kHz, 16 kHz, 22.05 kHz, 24 kHz, 32 kHz, 44.1 kHz, and/or 48 kHz. The CODEC 172 may also support mixing of a plurality of audio sources. For example, the CODEC 172 may support audio sources such as general audio, polyphonic ringer, I²S FM audio, vibration driving signals, and voice. In this regard, the general audio and polyphonic ringer sources may support the plurality of sampling rates that the audio CODEC 172 is enabled to accept, while the voice source may support a portion of the plurality of sampling rates, such as 8 kHz and 16 kHz, for example.

The chip 162 may comprise an integrated circuit with multiple functional blocks integrated within, such as the transceiver 152, the processor 156, the baseband processor 154, the BT radio/processor 163, the CODEC 172, and the leaky wave antenna 164A. The number of functional blocks integrated in the chip 162 is not limited to the number shown in FIG. 1. Accordingly, any number of blocks may be integrated on the chip 162 depending on chip space and wireless device 150 requirements, for example.

The leaky wave antennas 164A, 164B, and 164C may comprise a resonant cavity with a highly reflective surface and a lower reflectivity surface, and may be integrated in and/or on the chip 162, the package 167, and/or the printed circuit board 171. The reduced reflectivity surface may allow the resonant mode to "leak" out of the cavity. The lower reflectivity surface of the leaky wave antennas 164A, 1648, and 164C may be configured with slots in a metal surface, or a pattern of metal patches, as described further in FIGS. 2 and 3. The physical dimensions of the leaky wave antennas 164A, 164B, and 164C may be configured to optimize bandwidth of transmission and/or the beam pattern radiated. In another embodiment of the invention, the leaky wave antenna 164B may be integrated on the package 167, and the leaky wave antenna 164C may be integrated in and/or on the printed circuit board 171 to which the chip 162 may be affixed. In this manner, the dimensions of the leaky wave antennas 164B and 164C may not be limited by the size of the chip 162.

In an exemplary embodiment of the invention, the leaky wave antennas 164A, 164B, and/or 164C may enable the amplitude modulation of power amplifiers in the wireless device 150. For example, a bias voltage applied to the antennas 164A, 164B, and/or 164C may be modulated thereby modulating the amplitude of the transmitted signal.

The external headset port 166 may comprise a physical connection for an external headset to be communicatively coupled to the wireless device 150. The analog microphone 168 may comprise suitable circuitry, logic, interface(s), and/or code that may detect sound waves and convert them to electrical signals via a piezoelectric effect, for example. The electrical signals generated by the analog microphone 168 may comprise analog signals that may require analog to digital conversion before processing.

The package 167 may comprise a ceramic package, a printed circuit board, or other support structure for the chip 162 and other components of the wireless device 150. In this regard, the chip 162 may be bonded to the package 167. The package 167 may comprise insulating and conductive material, for example, and may provide isolation between electrical components mounted on the package 167.

The stereo speakers 170 may comprise a pair of speakers that may be operable to generate audio signals from electrical signals received from the CODEC 172. The HAC coil 174 may comprise suitable circuitry, logic, and/or code that may enable communication between the wireless device 150 and a T-coil in a hearing aid, for example. In this manner, electrical audio signals may be communicated to a user that utilizes a hearing aid, without the need for generating sound signals via a speaker, such as the stereo speakers 170, and converting the generated sound signals back to electrical signals in a hearing aid, and subsequently back into amplified sound signals in the user's ear, for example.

The dual digital microphone 176 may comprise suitable circuitry, logic, interface(s), and/or code that may be operable to detect sound waves and convert them to electrical signals. The electrical signals generated by the dual digital microphone 176 may comprise digital signals, and thus may not require analog to digital conversion prior to digital processing in the CODEC 172. The dual digital microphone 176 may enable beamforming capabilities, for example.

The vibration transducer 178 may comprise suitable circuitry, logic, interface(s), and/or code that may enable notification of an incoming call, alerts and/or message to the wireless device 150 without the use of sound. The vibration transducer may generate vibrations that may be in synch with, for example, audio signals such as speech or music.

In operation, control and/or data information, which may comprise the programmable parameters, may be transferred from other portions of the wireless device 150, not shown in FIG. 1, to the processor 156. Similarly, the processor 156 may be enabled to transfer control and/or data information, which may include the programmable parameters, to other portions of the wireless device 150, not shown in FIG. 1, which may be part of the wireless device 150.

The processor 156 may utilize the received control and/or data information, which may comprise the programmable parameters, to determine an operating mode of the transceiver 152. For example, the processor 156 may be utilized to select a specific frequency for a local oscillator, a specific gain for a variable gain amplifier, configure the local oscillator and/or configure the variable gain amplifier for operation in accordance with various embodiments of the invention. Moreover, the specific frequency selected and/or parameters needed to calculate the specific frequency, and/or the specific gain value and/or the parameters, which may be utilized to calculate the specific gain, may be stored in the system memory 158 via the processor 156, for example. The information stored in system memory 158 may be transferred to the transceiver 152 from the system memory 158 via the processor 156.

The CODEC 172 in the wireless device 150 may communicate with the processor 156 in order to transfer audio data and control signals. Control registers for the CODEC 172 may reside within the processor 156. The processor 156 may exchange audio signals and control information via the system memory 158. The CODEC 172 may up-convert and/or down-convert the frequencies of multiple audio sources for processing at a desired sampling rate.

The wireless signals may be transmitted and received by the leaky wave antennas 164A, 164B, and 164C. The beam pattern radiated from the leaky wave antennas 164A, 164B, and 164C may be configured by adjusting the frequency of the signal communicated to the leaky wave antennas 164A, 164B, and 164C. Furthermore, the physical characteristics of the leaky wave antennas 164A, 164B, and 164C may be configured to adjust the bandwidth of the transmitted signal.

In an embodiment of the invention, the power amplifiers in the transceiver 152 may be operable to provide amplitude modulation by modulating the bias current in one or more stages of the power amplifiers. In addition, the bias voltage for the power amplifiers applied to the leaky wave antennas 164A, 164B, and/or 164C may be scaled to improve efficiency. In this manner, linear amplitude modulation, high power control dynamic range and high output power may be achieved.

Figure 2:
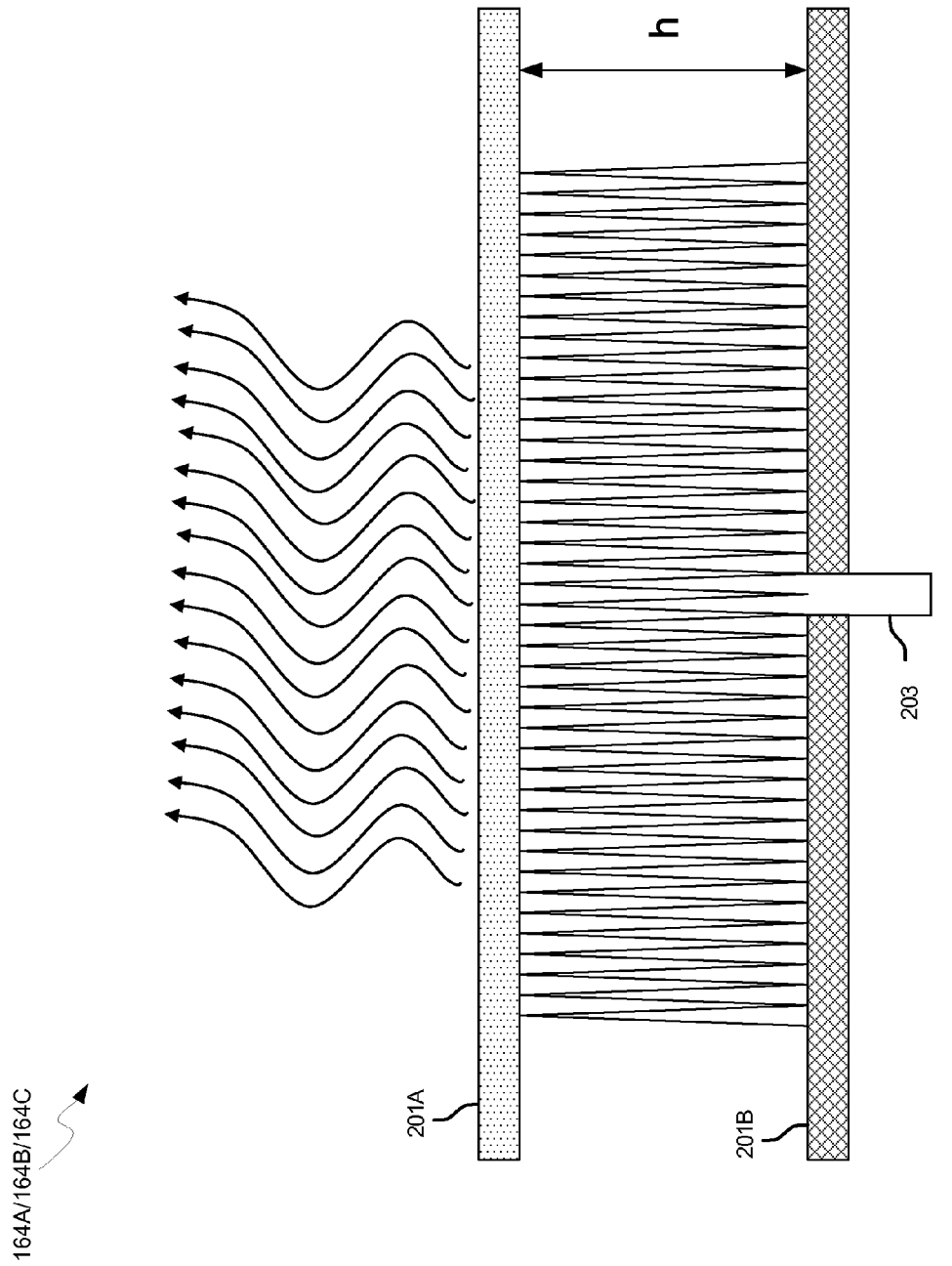
FIG. 2 is a block diagram illustrating an exemplary leaky wave antenna, in accordance with an embodiment of the invention.

FIG. 2 is a block diagram illustrating an exemplary leaky wave antenna, in accordance with an embodiment of the invention. Referring to FIG. 2, there is shown the leaky wave antenna 164A, 164B, and/or 164C comprising a partially reflective surface 201A, a reflective surface 201B, and a feed point 203. The space between the partially reflective surface 201A and the reflective surface 201B may be filled with dielectric material, for example, and the height, h, between the partially reflective surface 201A and the reflective surface 201B may be utilized to configure the frequency of transmission of the leaky wave antenna 164A, 164B, and/or 164C.

The feed point 203 may comprise a input terminal for applying an input voltage to the leaky wave antenna 164A, 164B, and/or 164C. The invention is not limited to a single feed point 203, as there may be any amount of feed points for different phases of signal, for example, to be applied to the leaky wave antenna 164A, 164B, and/or 164C.

In an embodiment of the invention, the height, h, may be one-half the wavelength of the transmitted mode from the leaky wave antenna 164A, 164B, and/or 164C. In this manner, the phase of an electromagnetic mode that traverses the cavity twice may be coherent with the input signal at the feed point 203, thereby configuring a resonant cavity known as a Fabry-Perot cavity. The magnitude of the resonant mode may decay exponentially in the lateral direction from the feed point 203, thereby reducing or eliminating the need for confinement structures to the sides of the leaky wave antenna 164A, 164B, and/or 164C. The input impedance of the leaky wave antenna 164A, 164B, and/or 164C may be configured by the vertical placement of the feed point 203, as described further in FIG. 6.

In operation, a signal to be transmitted via a power amplifier may be communicated to the feed point 203 of the leaky wave antenna 164A, 164B, and/or 164C with a frequency f. The cavity height, h, may be configured to correlate to one half the wavelength of the signal of frequency f. The signal may traverse the height of the cavity and may be reflected by the partially reflective surface 201A, and then traverse the height back to the reflective surface 201B. Since the wave will have travelled a distance corresponding to a full wavelength, constructive interference may result and a resonant mode may thereby be established.

Leaky wave antennas may enable the configuration of high gain antennas without the need for a large array of antennas which require a complex feed network and suffer from loss due to feed lines. The leaky wave antenna 164A, 164B, and/or 164C may be integrated on or in a chip, package, or printed circuit board. The leaky wave antenna 164A, 164B, and/or 164C may comprise a load on a power amplifier. The input impedance of the leaky wave antenna 164A, 164B, and/or 164C may be configured to match the output impedance of the power amplifier. In this manner, matching circuit requirements may be reduced or eliminated.

In an exemplary embodiment of the invention, the leaky wave antennas 164A, 164B, and/or 164C may enable the amplitude modulation of power amplifiers in the wireless device 150. For example, a bias voltage applied to the antennas 164A, 164B, and/or 164C may be modulated thereby modulating the amplitude of the transmitted signal.

The beam shape of the transmitted may comprise a narrow vertical beam when the frequency of the signal communicated to the feed point 203 matches the resonant frequency of the cavity. In instances where the frequency shifts from the center frequency, the beam shape may become conical, with nodes at an angle from vertical. This is described further with respect to FIGS. 4 and 5.

In an embodiment of the invention, the leaky wave antennas 164A, 164B, and/or 164C may be configured as a balun with a bias voltage, VDD, which may be utilized to control the output voltage swing of a power amplifier. In addition, amplitude modulation in the power amplifier may be enabled by controlling the bias current. In this manner, linear amplitude modulation, high power control dynamic range and high output power may be achieved.

Figure 3:
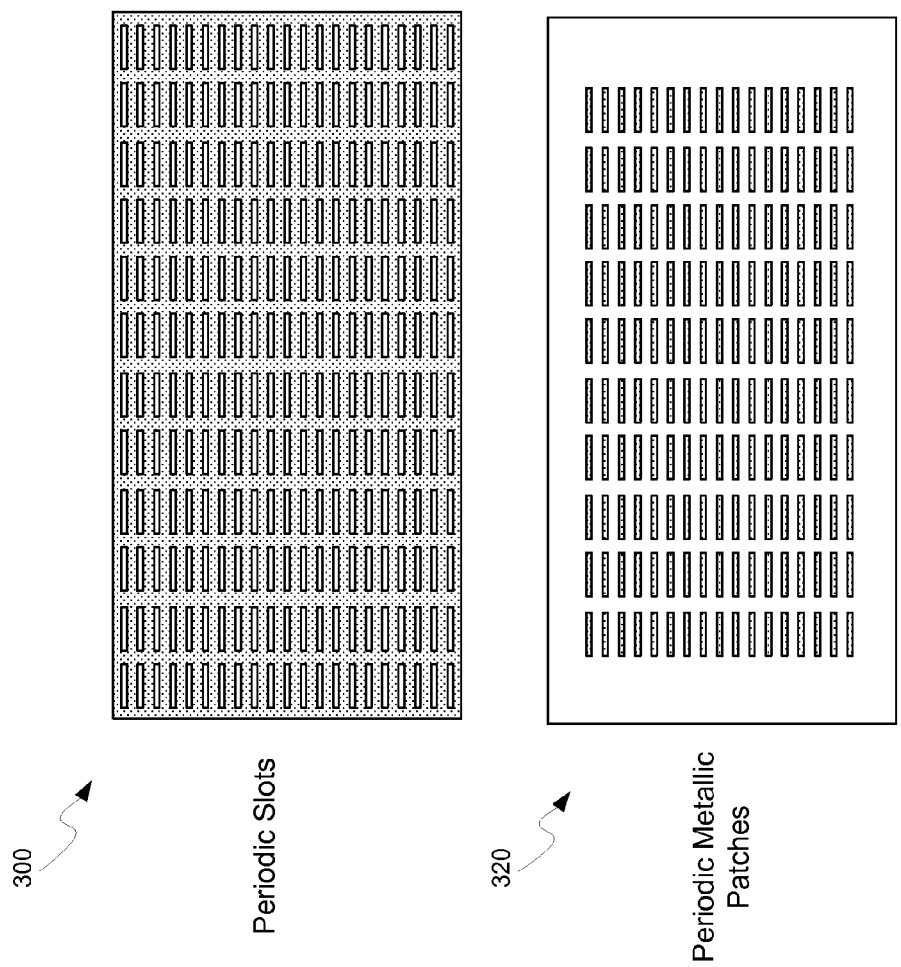
FIG. 3 is a block diagram illustrating a plan view of exemplary partially reflective surfaces, in accordance with an embodiment of the invention.

FIG. 3 is a block diagram illustrating a plan view of exemplary partially reflective surfaces, in accordance with an embodiment of the invention. Referring to FIG. 3, there is shown a partially reflective surface 300 comprising periodic slots in a metal surface, and a partially reflective surface 320 comprising periodic metal patches. The partially reflective surfaces 300/320 may comprise different embodiments of the partially reflective surface 201A described with respect to FIG. 2.

The spacing, dimensions, shape, and orientation of the slots and/or patches in the partially reflective surfaces 300/320 may be utilized to configure the bandwidth, and thus Q-factor, of the resonant cavity defined by the partially reflective surfaces 300/320 and a reflective surface, such as the reflective surface 201B, described with respect to FIG. 2. The partially reflective surfaces 300/320 may thus comprise frequency selective surfaces due to the narrow bandwidth of signals that may leak out of the structure as configured by the slots and/or patches.

The spacing between the patches and/or slots may be related to wavelength of the signal transmitted and/or received, which may be somewhat similar to beamforming with multiple antennas. The length of the slots and/or patches may be several times larger than the wavelength of the transmitted and/or received signal or less, for example, since the leakage from the slots and/or regions surround the patches may add up, similar to beamforming with multiple antennas.

In an embodiment of the invention, the slots/patches may be configured via micro-electromechanical system (MEMS) switches to tune the Q of the resonant cavity.

Figure 4:
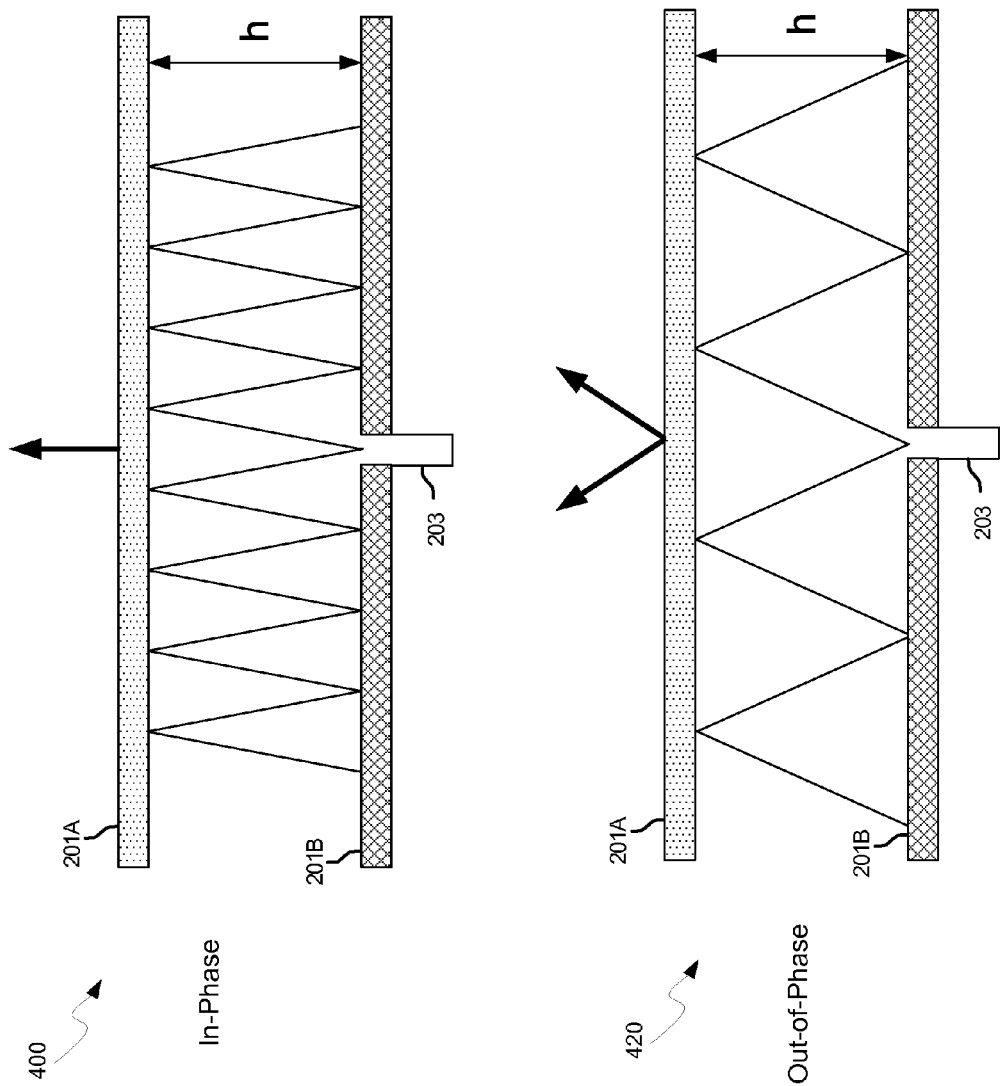
FIG. 4 is a block diagram illustrating an exemplary phase dependence of a leaky wave antenna, in accordance with an embodiment of the invention.

FIG. 4 is a block diagram illustrating an exemplary phase dependence of a leaky wave antenna, in accordance with an embodiment of the invention. Referring to FIG. 4, there is shown a leaky wave antenna comprising the partial reflective surface 201A, the reflective surface 201B, and the feed point 203. In-phase condition 400 illustrates the relative beam shape transmitted by the leaky wave antenna 164A, 164B, and/or 164C when the frequency of the signal communicated to the feed point 203 matches that of the resonant cavity as defined by the cavity height h and the dielectric constant of the material between the reflective surfaces.

Similarly, the out-of-phase condition 420 illustrates the relative beam shape transmitted by the leaky wave antenna 164A, 164B, and/or 164C when the frequency of the signal communicated to the feed point 203 does not match that of the resonant cavity. The resulting beam shape may be conical, as opposed to a single main vertical node. These are illustrated further with respect to FIG. 5.

Figure 5:
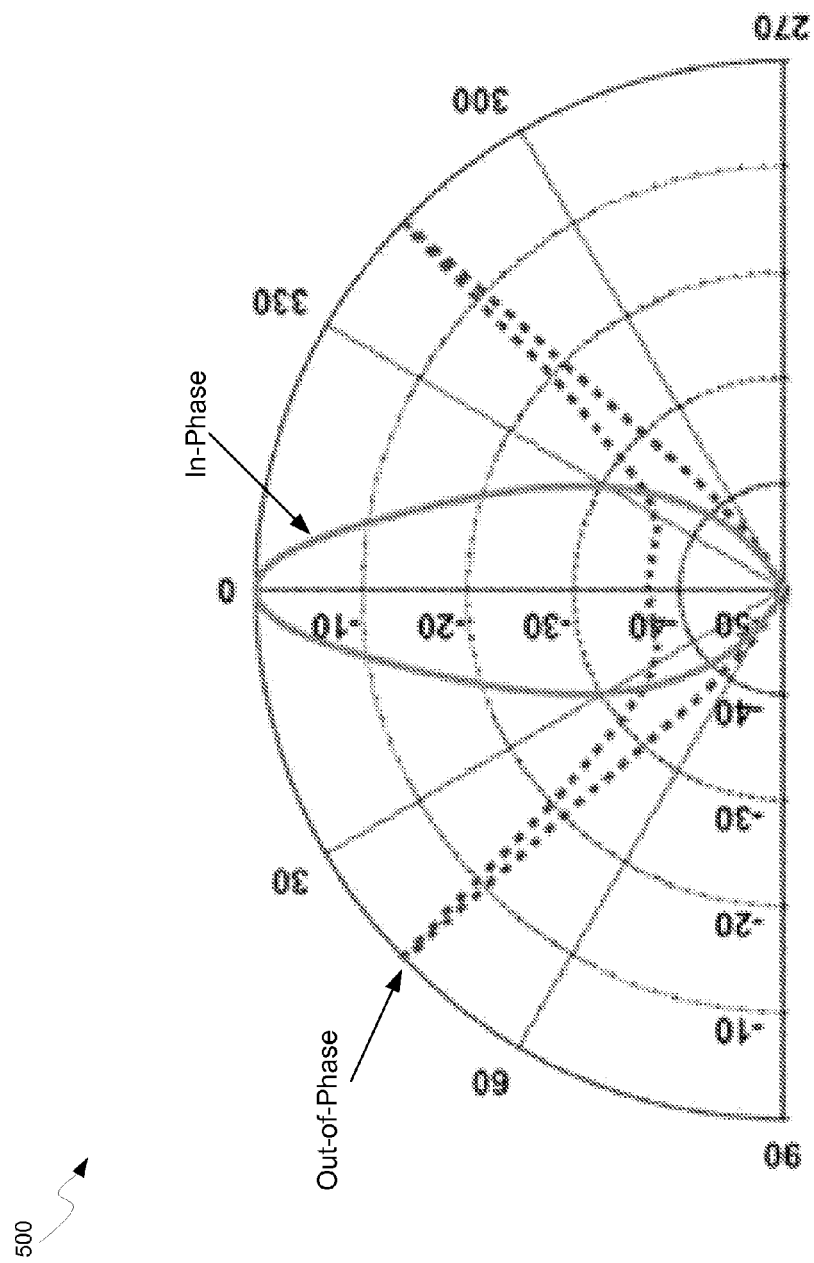
FIG. 5 is a block diagram illustrating exemplary in-phase and out-of-phase beam shapes for a leaky wave antenna, in accordance with an embodiment of the invention.

FIG. 5 is a block diagram illustrating exemplary in-phase and out-of-phase beam shapes for a leaky wave antenna, in accordance with an embodiment of the invention. Referring to FIG. 5, there is shown a plot 500 of transmitted signal beam shape versus angle for the in-phase and out-of-phase conditions for a leaky wave antenna.

The In-phase curve in the plot 500 may correlate to the case where the frequency of the signal communicated to a leaky wave antenna matches the resonant frequency of the cavity. In this manner, a single vertical main node may result. In instances where the frequency of the signal at the feed point is not at the resonant frequency, a double, or conical-shaped node may be generated as shown by the Out-of-phase curve in the plot 500.

Figure 6:
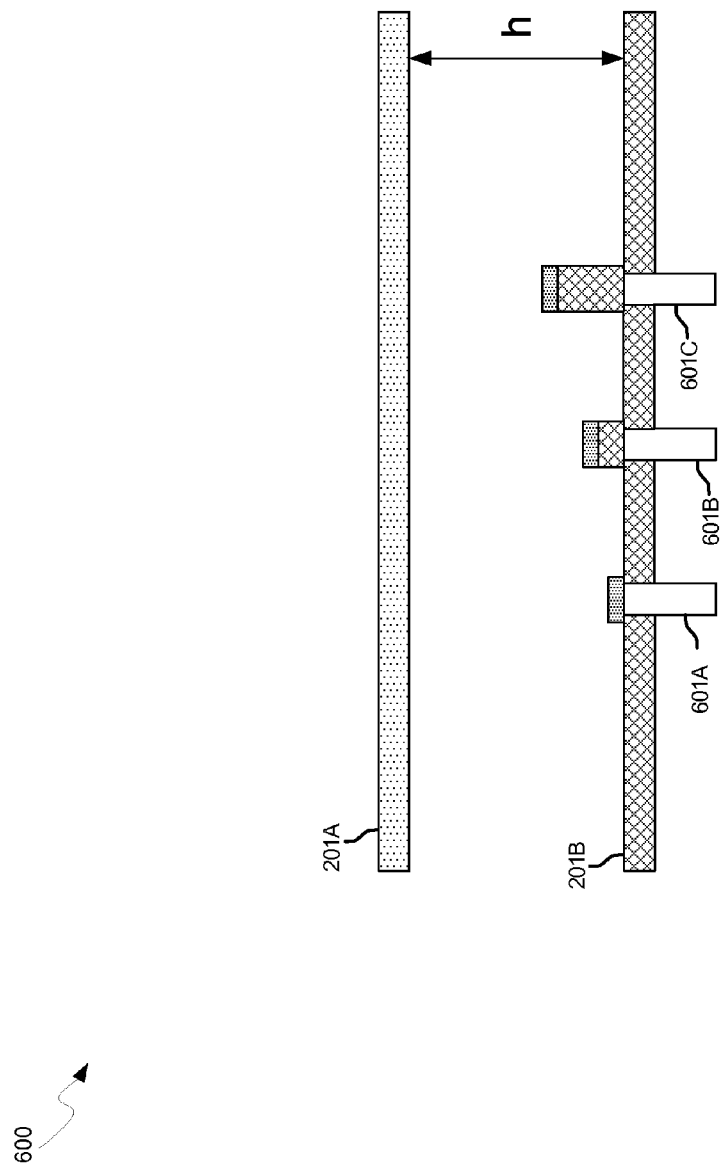
FIG. 6 is a block diagram illustrating a leaky wave antenna with variable input impedance feed points, in accordance with an embodiment of the invention.

FIG. 6 is a block diagram illustrating a leaky wave antenna with variable input impedance feed points, in accordance with an embodiment of the invention. Referring to FIG. 6, there is shown a leaky wave antenna 600 comprising the partially reflective surface 201A and the reflective surface 201B. There is also shown feed points 601A-601C. The feed points 601A-601C may be located at different positions along the height, h, of the cavity thereby configuring different impedance points for the leaky wave antenna.

In this manner, a leaky wave antenna may be operable to couple to power amplifiers with different output impedances thereby increasing coupling efficiency without requiring impedance matching circuits. Higher impedance PAs may be coupled to feed points placed higher in the cavity and lower impedance PAs may be coupled to feed points placed closer to the reflective surface 201B.

Figure 7A:
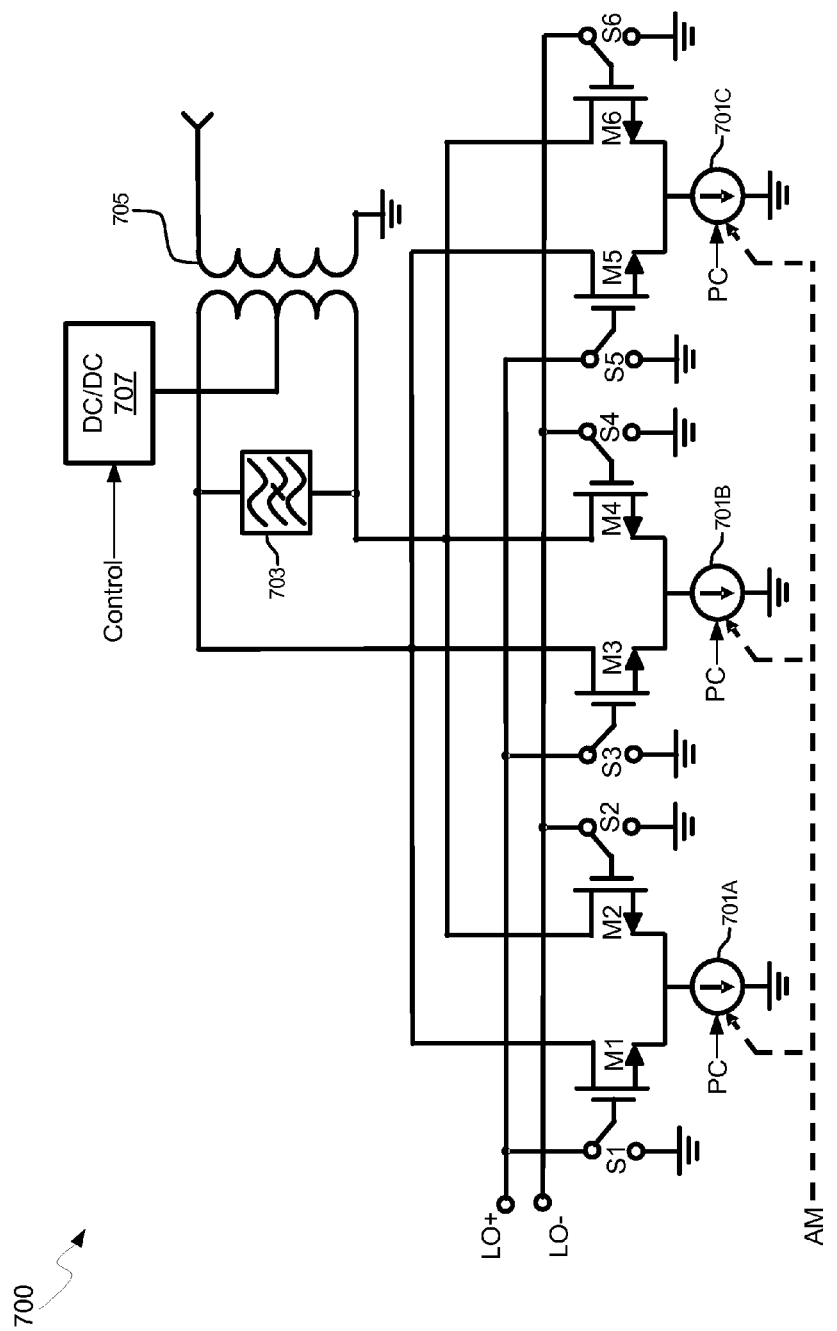
FIG. 7A is a block diagram of an exemplary multi-stage power amplifier utilizing a leaky wave antenna as a load and enabling amplitude modulation, in accordance with an embodiment of the invention.

FIG. 7A is a block diagram of an exemplary multi-stage power amplifier utilizing a leaky wave antenna as a load and enabling amplitude modulation, in accordance with an embodiment of the invention. Referring to FIG. 7A, there is shown a power amplifier (PA) 700 comprising the CMOS transistors M1-M6, current sources 701A-701C, a notch filter 703, switches S1-S6, a balun 705, and a DC-to-DC controller 707. There is also shown input signals LO+ and LO−, an amplitude modulation signal AM, a power control signal, PC, and a control signal, Control, communicated to the DC-to-DC controller 607.

The current sources 701A may comprise suitable circuitry, logic, interfaces, and/or code that may be operable to provide bias currents to the various stages of the PA 700. The current sources 701A-701C may comprise one or more CMOS transistors of varying size and thus current flow for a given gate and drain-source voltages. In an embodiment of the invention, the current source 701B may supply a current eight times higher than the current source 701A, and the current source 701C may supply a current eight times higher than the current source 701B. In another embodiment of the invention, the current sources 701A-701C may be binary weighted where each current source supplies double or half the current of an adjacent current source.

The transistors M1-M6 may comprise the various gain stages of the PA 700, and may be configured to operate in differential mode or common mode. The switches S1-S6 may be operable to configure the input stages, comprising the gate terminals of the transistors M1-M6, to operate in differential mode or common mode. In differential mode, both switches in a transistor pair, switches S1 and S2 for CMOS transistors M1 and M2, for example, may be switched to the LO+ and LO− input signals. Similarly, switch S2 may be switched to ground, and switch S1 may be coupled to the LO+ input signal, thereby configuring the M1/M2 stage in common mode.

The number of stages in the PA 700 is not limited to the number shown in FIG. 7A. Accordingly, any number of stages may be utilized depending on chip space and power requirements, for example.

The notch filter 703 may comprise suitable circuitry, logic, interfaces, and/or code that may be operable to filter out signals in a narrow frequency band while allowing signals to pass through that are outside that frequency band.

The balun 705 may comprise suitable circuitry, logic, interfaces, and/or code that may be operable to convert a balanced signal to an unbalanced signal. The output of the balun 705 may be communicatively coupled to a leaky wave antenna as a load for the balun 705 and the PA 700. In another embodiment of the invention, the balun 705 may comprise a leaky wave antenna with multiple input feed points to enable reception of balanced signals.

In operation, a local oscillator signal comprising LO+ and LO− may be communicated to the gain stages comprising the CMOS transistor pairs M1/M2, M3/M4, and M5/M6. The switches S1-S6 may be utilized to configure the PA stages in differential or common mode. Amplitude modulation may be applied via the AM signal that may be operable to modulate the current sources 701A-701C, thereby modulating the output signal amplitude of the PA 700. In addition, the power output may be configured utilizing the DC-to-DC controller 707 via the Control signal. In this manner, the maximum voltage swing of the signal communicated to an antenna may be configured.

In an embodiment of the invention, the balun 705 may communicate the balanced signal generated by the PA 700 as an unbalanced signal to an antenna coupled to the balun 705. In another embodiment of the invention, the balun 705 may comprise a leaky wave antenna, thereby enabling the reception of balanced signals to be transmitted by the leaky wave antenna configured as a balun. The balun 705 may then also comprise a load for the PA 700 which may be configured for a desired impedance for proper matching. In this manner, a conventional tuned circuit, matching circuit, and antenna may be replaced by a leaky wave antenna on a PA.

In an embodiment of the invention, amplitude modulation may be enabled by applying an AM signal to the current sources 701A-701C. In addition, a power control signal, PC, may be applied to the current sources in 701A-701C. This is described further with respect to FIG. 7B. The AM signal may cause the current flow through the transistors M1-M6 to modulate, thereby modulating the amplitude of the signal transmitted by the leaky wave antenna.

In instances of non-linear amplification, the bias voltage generated by the DC-to-DC controller 707 via the Control signal may provide amplitude modulation, but in linear amplification, the current source 701A-701C may be set digitally via the power control signal, PC, with an additional analog signal, AM, to modulate current sources 701A-701C, thereby enabling amplitude modulation. Utilizing the bias voltage on the leaky wave antenna may increase the efficiency of transmission.

Figure 7B:
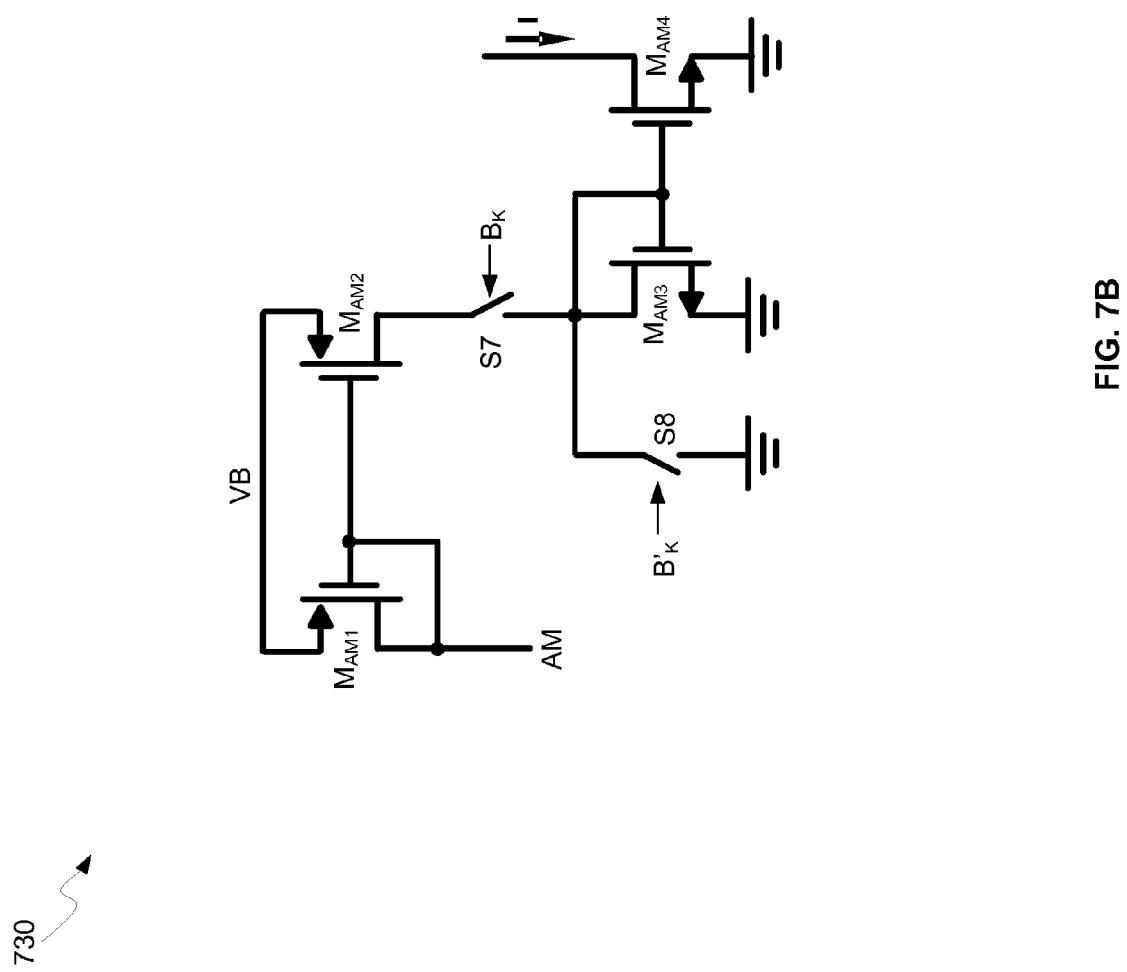
FIG. 7B is a block diagram of a current source for amplitude modulation, in accordance with an embodiment of the invention.

FIG. 7B is a block diagram of a current source for amplitude modulation, in accordance with an embodiment of the invention. Referring to FIG. 7B, there is shown a current source 730 comprising transistors $M_{AM1}$-$M_{AM4}$ and switches S7 and S8. There is also shown a bias voltage VB, switching signals $B_K$ and $B'_K$, a current I, and the amplitude modulation signal AM. The switching signals $B_K$ and $B'_K$ may comprise the power control signal PC described in FIG. 7B, where $B_K$ is the complement of $B'_K$.

The current source 730 may comprise a current mirror that may be operable to modulate the current I at a magnitude proportional to the amplitude modulation signal, AM. The proportionality may be configured by the size ratio of the CMOS transistors $M_{AM1}$ and $M_{AM2}$. In this manner, each of the current sources 701A-710C may have different ratios, thereby enabling a wide range of current available to the PA 700, described with respect to FIG. 7A.

The switches S7 and S8 may be operable to switch the gate terminals of the transistors $M_{AM3}$ and $M_{AM4}$ between ground and the drain terminal of the PMOS transistor MAM2.

In operation, the amplitude signal AM may be communicated to the gate terminals of the PMOS transistors $M_{AM1}$ and $M_{AM2}$. The modulation of the gate voltage of $M_{AM2}$ may result in a modulated current from source to drain of PMOS transistor $M_{AM2}$ when switch S7 is closed and switch S8 is open. This modulating current may then modulate the gate voltage of the NMOS transistors $M_{AM3}$ and $M_{AM4}$, which may result in the modulation of the current I at a magnitude that may be the magnitude of the AM signal times a proportionality factor defined by the PMOS transistors $M_{AM1}$ and $M_{AM2}$.

In instances where the switch S7 is open and switch S8 is closed, the gate terminals of $M_{AM3}$ and $M_{AM4}$ may be at ground thereby turning off the transistors $M_{AM3}$ and $M_{AM4}$ which may result in the current I approaching zero.

Figure 8:
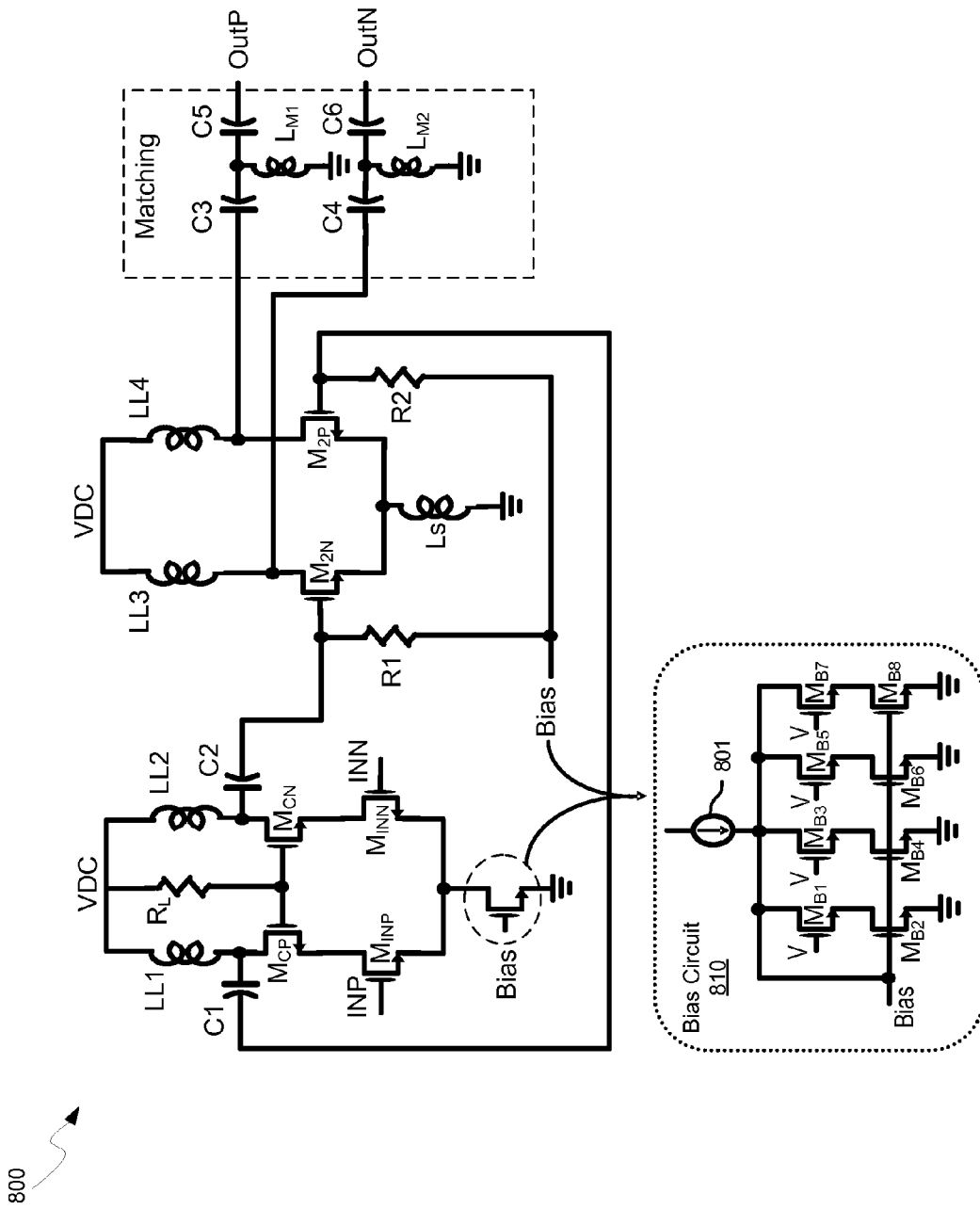
FIG. 8 is a block diagram illustrating amplitude modulation by an exemplary two stage power amplifier, which utilizes a leaky wave antenna as a load, in accordance with an embodiment of the invention.

FIG. 8 is a block diagram illustrating amplitude modulation by an exemplary two stage power amplifier, which utilizes a leaky wave antenna as a load, in accordance with an embodiment of the invention. Referring to FIG. 8, there is shown a power amplifier 800 comprising the transistors $M_{INP}$, $M_{INN}$, MCP, MCN, M2N, and M2P, the bias circuit 810, resistors $R_L$, R1, and R2, capacitors C1-C6, and inductors LL1-LL4, Ls, and $L_{M1}$-$L_{M2}$. There is also shown the input terminals INP and INN, output terminals OutP and OutN, a bias voltage VDC, a bias voltage V, and the bias control input Bias.

The bias circuit 810 may comprise CMOS transistors MB1-MB8 and a current source 801. The current source 801 may comprise suitable circuitry, logic, interfaces, and/or code that may be operable to supply a current to the CMOS transistors MB1-MB8. The Bias control input and the bias voltage V may be utilized to configure the bias current for the PA 800.

The transistors $M_{INP}$, $M_{INN}$, MCP, MCN, M2N, the inductors LL1 and LL2, and the resistor RL may comprise the first stage of the PA 800 and may comprise a cascode stage. The input to the first stage may comprise the INP and INN input terminals, and the output signal may be communicated to the second stage via the coupling capacitors C1 and C2. The second stage of the PA 800 may comprise the transistors M2N and M2P, and the inductors Ls, LL3, and LL4.

In a conventional PA, the second stage of the PA 800 may comprise discrete inductors LL3 and LL4 as loads for the PA and a matching circuit comprising capacitors C3-C6 and inductors LM1 and LM2, which may be communicated to an antenna. In an embodiment of the invention, the load inductors LL3 and LL4, the matching circuitry, and antenna may be replaced by a leaky wave antenna. The leaky wave antenna may provide the tuned circuit via the resonant frequency of the resonant cavity, and may provide an impedance matched to the PA 800 for increased coupling efficiency.

In operation, an input signal may be communicated to the INP and INN input terminals for amplification by the first and second stages of the PA 800. The bias conditions for the PA 800 may be configured via the Bias and V signals. In an embodiment of the invention, the load inductors LL3 and LL4 may comprise one or more leaky wave antennas that may be impedance matched to the PA 800, thereby eliminating the need for the matching circuitry comprising the capacitors C3-C6 and inductors LM1 and LM2.

The inductors LL3 and LL4 that may comprise leaky wave antennas may transmit the amplified signal in a direction defined by the geometry of the leaky wave antenna as described with respect to FIGS. 2-5. The PA 800 may be operable to provide amplitude modulation by modulating the bias current in the two gain stages. In addition, the bias voltage VDC may be adjusted to tune output power while improving efficiency.

Figure 9:
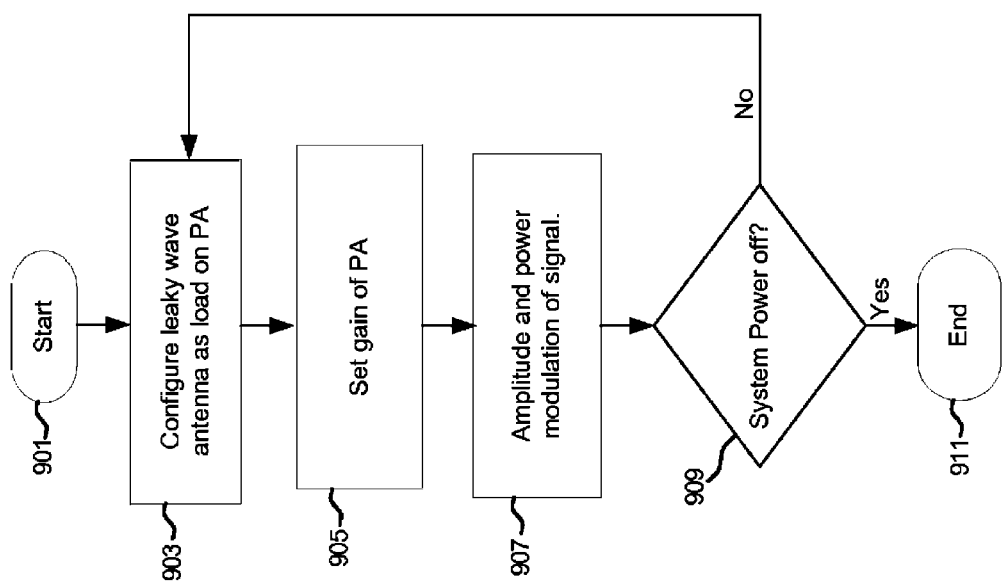
FIG. 9 is a block diagram illustrating exemplary steps for amplitude modulating a power amplifier that incorporates a leaky wave antenna, in accordance with an embodiment of the invention.

FIG. 9 is a block diagram illustrating exemplary steps for amplitude modulating a power amplifier that incorporates a leaky wave antenna, in accordance with an embodiment of the invention. Referring to FIG. 9, in step 903 after start step 901, the leaky wave antenna may be configured as a load on the PA enabling transmission at a desired frequency. In step 905, the gain of the PA may be configured to a desired level. In step 907, an amplitude modulation signal may be configured to modulate the output signal of the PA by modulating a bias current in the PA. Additionally, the output power of the PA may be modulated by tuning a bias voltage of the PA. If, in step 909, the wireless device 150 is to be powered down, the exemplary steps may proceed to end step 911. However, if the wireless device 150 is not to be powered down, the exemplary steps may proceed to step 903 to configure the leaky wave antenna.

In an embodiment of the invention, a method and system are disclosed for amplitude modulating an output of one or more power amplifiers 700/800 in a wireless device 150 by modulating a bias current in the one or more power amplifiers 700/800 that are coupled to one or more leaky wave antennas 164A, 164B, and/or 164C. In this regard, an amplitude modulated signal may be transmitted from the one or more leaky wave antennas 164A and/or 164B. The one or more leaky wave antennas 164A, 164B, and/or 164C may comprise a balun 705 that may be integrated on the chip 162, integrated on a package 167 to which the chip 162 may be affixed, and/or integrated on a printed circuit board 171 to which the chip 162 may be affixed. An output power of the one or more power amplifiers 700/800 may be adjusted by configuring a bias voltage on the one or more leaky wave antennas 164A, 164B, and/or 164C. The bias voltage may be configured utilizing a DC to DC voltage controller 707. The bias current may be modulated via one or more switched current sources 701A-701C/730. The one or more switched current sources 701A-701C/730 may be binary weighted and/or may be current mirrors.

Another embodiment of the invention may provide a machine and/or computer readable storage and/or medium, having stored thereon, a machine code and/or a computer program having at least one code section executable by a machine and/or a computer, thereby causing the machine and/or computer to perform the steps as described herein for amplitude modulation using a leaky wave antenna.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for communication, the method comprising:
performing using one or more circuits in a wireless device, said one or more circuits comprising one or more power amplifiers on a chip, wherein said one or more power amplifiers are coupled to one or more leaky wave antennas without using matching circuitry for said one or more power amplifiers:
modulating a bias current in said one or more power amplifiers; and
amplitude modulating an output of said one or more power amplifiers utilizing said modulated bias current.

2. The method according to claim 1, wherein said one or more leaky wave antennas comprise a balun.

3. The method according to claim 1, wherein said one or more leaky wave antennas are integrated on said chip.

4. The method according to claim 1, wherein said one or more leaky wave antennas are integrated on a package to which said chip is affixed.

5. The method according to claim 1, wherein said one or more leaky wave antennas are integrated on a printed circuit board to which said chip is affixed.

6. The method according to claim 1, comprising adjusting an output power of said one or more power amplifiers by configuring a bias voltage on said one or more leaky wave antennas.

7. The method according to claim 6, comprising configuring said bias voltage utilizing a DC to DC voltage controller.

8. The method according to claim 1, comprising modulating said bias current via one or more switched current sources.

9. The method according to claim 8, wherein said one or more switched current sources are binary weighted.

10. The method according to claim 8, wherein said one or more switched current sources are current mirrors.

11. A system for enabling communication, the system comprising:
one or more or more circuits in a wireless device, said one or more circuits comprising one or more power amplifiers on a chip, said one or more power amplifiers are coupled to one or more leaky wave antennas without using matching circuitry for said one or more power amplifiers, wherein said one or more or more circuits are operable to:
modulate a bias current in said one or more power amplifiers; and
amplitude modulate an output of said one or more power amplifiers utilizing said modulated bias current.

12. The system according to claim 11, wherein said one or more leaky wave antennas comprise a balun.

13. The system according to claim 11, wherein said one or more leaky wave antennas are integrated on said chip.

14. The system according to claim 11, wherein said one or more leaky wave antennas are integrated on a package to which said chip is affixed.

15. The system according to claim 11, wherein said one or more leaky wave antennas are integrated on a printed circuit board to which said chip is affixed.

16. The system according to claim 11, wherein said one or more circuits are operable to adjust an output power of said one or more power amplifiers by configuring a bias voltage on said one or more leaky wave antennas.

17. The system according to claim 16, wherein said one or more circuits are operable to configure said bias voltage utilizing a DC to DC voltage controller.

18. The system according to claim 11, wherein said one or more circuits are operable to modulate said bias current via one or more switched current sources.

19. The system according to claim 18, wherein said one or more switched current sources are binary weighted.

20. The system according to claim 18, wherein said one or more switched current sources are current mirrors.

* * * * *